United States Patent
Terada

(10) Patent No.: US 10,199,349 B2
(45) Date of Patent: Feb. 5, 2019

(54) MOUNTING DEVICE AND MOUNTING METHOD

(71) Applicant: TORAY ENGINEERING CO., LTD., Chuo-ku, Tokyo (JP)

(72) Inventor: Katsumi Terada, Otsu (JP)

(73) Assignee: TORAY ENGINEERING CO., LTD., Tokyo (JP)

(*) Notice: Subject to any disclaimer, the term of this patent is extended or adjusted under 35 U.S.C. 154(b) by 51 days.

(21) Appl. No.: 15/546,553

(22) PCT Filed: Feb. 2, 2016

(86) PCT No.: PCT/JP2016/052971
§ 371 (c)(1),
(2) Date: Jul. 26, 2017

(87) PCT Pub. No.: WO2016/125764
PCT Pub. Date: Aug. 11, 2016

(65) Prior Publication Data
US 2018/0019223 A1 Jan. 18, 2018

(30) Foreign Application Priority Data
Feb. 3, 2015 (JP) .................. 2015-019394

(51) Int. Cl.
*H01L 23/00* (2006.01)
*H01L 21/683* (2006.01)
(Continued)

(52) U.S. Cl.
CPC ......... *H01L 24/75* (2013.01); *H01L 21/6838* (2013.01); *H01L 24/81* (2013.01);
(Continued)

(58) Field of Classification Search
None
See application file for complete search history.

(56) References Cited

U.S. PATENT DOCUMENTS

2018/0019223 A1* 1/2018 Terada ................... H01L 24/92

FOREIGN PATENT DOCUMENTS

| JP | 2004-031885 A | 1/2004 |
| JP | 2007-258519 A | 10/2007 |
| JP | 2014-060241 A | 4/2014 |

OTHER PUBLICATIONS

International Search Report of the corresponding International Application No. PCT/JP2016/052971, dated Apr. 26, 2016.

* cited by examiner

*Primary Examiner* — Jack Chen
(74) *Attorney, Agent, or Firm* — Global IP Counselors, LLP

(57) ABSTRACT

A mounting device includes a thermocompression bonding head, a pressure reduction mechanism, and a resin sheet feed mechanism. The thermocompression bonding head is configured to heat a semiconductor chip while holding the semiconductor chip and to bond the semiconductor chip to a joined piece by compression. The thermocompression bonding head has a suction hole in a face that holds the semiconductor chip. The pressure reduction mechanism communicates with the suction hole and is configured to reduce pressure inside the suction hole. The resin sheet feed mechanism is configured to supply a resin sheet between the thermocompression bonding head and the semiconductor chip. An electrode that protrudes from a top face of the semiconductor chip is bonded by thermocompression after being embedded in the resin sheet.

20 Claims, 9 Drawing Sheets

(51) Int. Cl.
H01L 25/065 (2006.01)
H01L 25/00 (2006.01)

(52) U.S. Cl.
CPC .............. H01L 24/83 (2013.01); H01L 24/92 (2013.01); H01L 24/13 (2013.01); H01L 24/14 (2013.01); H01L 24/16 (2013.01); H01L 24/32 (2013.01); H01L 24/73 (2013.01); H01L 25/0657 (2013.01); H01L 25/50 (2013.01); H01L 2224/13101 (2013.01); H01L 2224/14181 (2013.01); H01L 2224/16145 (2013.01); H01L 2224/16225 (2013.01); H01L 2224/32145 (2013.01); H01L 2224/32225 (2013.01); H01L 2224/73204 (2013.01); H01L 2224/75 (2013.01); H01L 2224/7592 (2013.01); H01L 2224/75252 (2013.01); H01L 2224/75301 (2013.01); H01L 2224/75303 (2013.01); H01L 2224/75611 (2013.01); H01L 2224/75745 (2013.01); H01L 2224/75821 (2013.01); H01L 2224/81 (2013.01); H01L 2224/81005 (2013.01); H01L 2224/81132 (2013.01); H01L 2224/81203 (2013.01); H01L 2224/81801 (2013.01); H01L 2224/81908 (2013.01); H01L 2224/831 (2013.01); H01L 2224/83005 (2013.01); H01L 2224/83101 (2013.01); H01L 2224/83132 (2013.01); H01L 2224/83191 (2013.01); H01L 2224/83192 (2013.01); H01L 2224/83203 (2013.01); H01L 2224/83855 (2013.01); H01L 2224/83862 (2013.01); H01L 2224/83908 (2013.01); H01L 2224/92125 (2013.01); H01L 2225/06513 (2013.01); H01L 2225/06517 (2013.01); H01L 2924/07802 (2013.01)

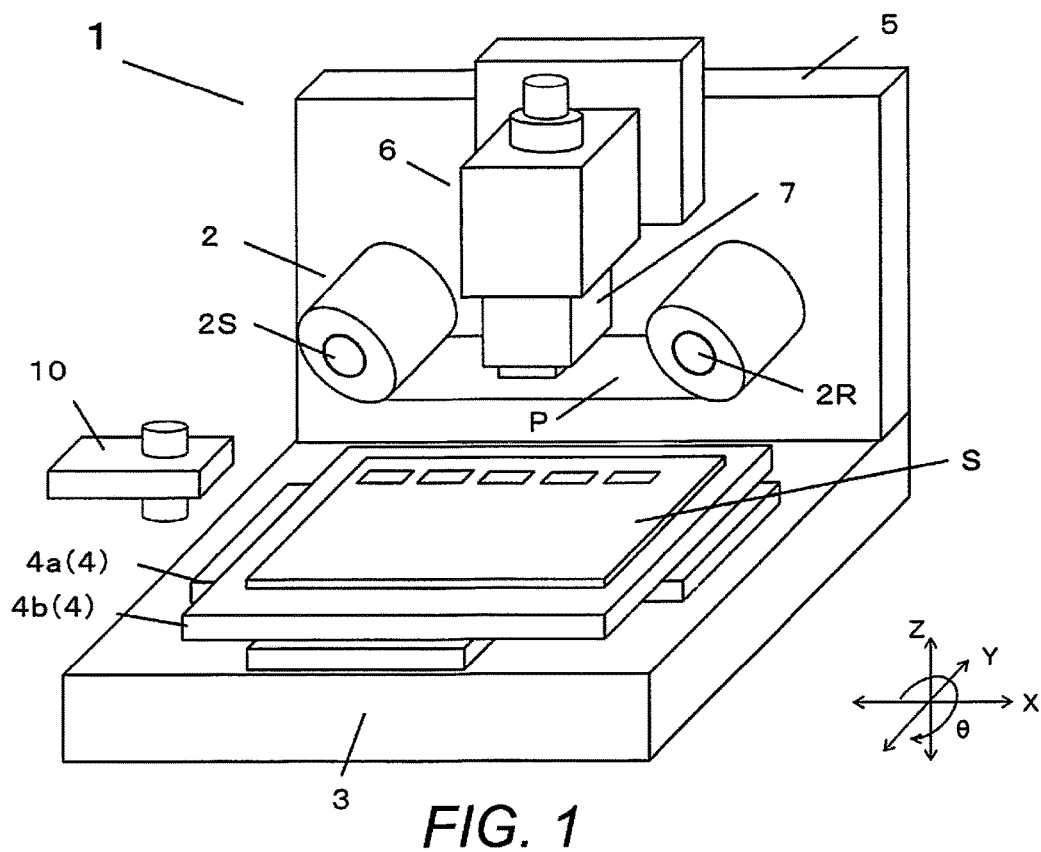
FIG. 1
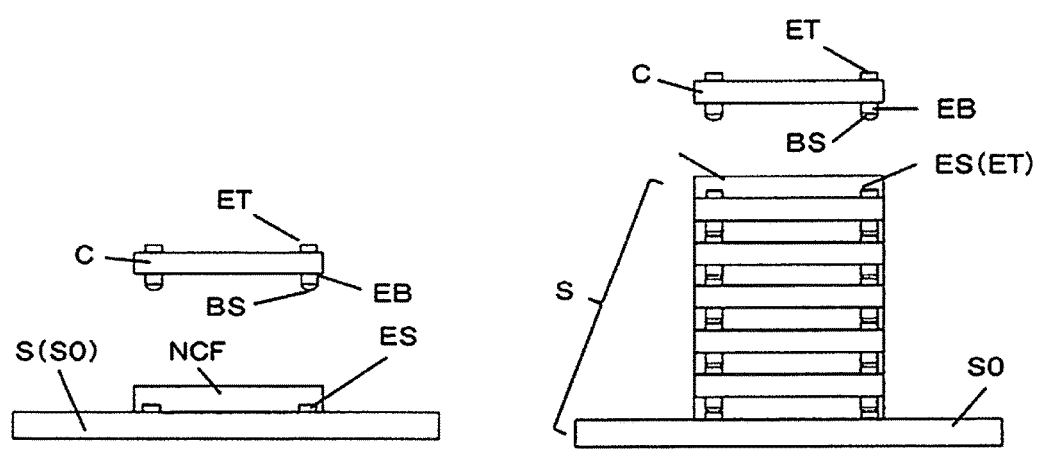
FIG. 2A
FIG. 2B

MOUNTING DEVICE AND MOUNTING METHOD

CROSS-REFERENCE TO RELATED APPLICATIONS

This application is a U.S. National stage of International Application No. PCT/JP2016/052971 filed on Feb. 2, 2016. This application claims priority to Japanese Patent Application No. 2015-019394 filed with Japan Patent Office on Feb. 3, 2015. The entire disclosure of Japanese Patent Application No. 2015-019394 is hereby incorporated herein by reference.

BACKGROUND

Field of the Invention

The present invention relates to a mounting device and a mounting method. More precisely, it relates to a mounting device and a mounting method with which a semiconductor chip having electrodes on its top and bottom faces is bonded by thermocompression to a joined piece that is disposed on the lower side of the semiconductor chip and has an electrode on its top face, in a state in which an adhesive is interposed between the two.

Background Information

A flip chip method is a known way to mount a semiconductor chip on a substrate. With a flip chip method, a flip chip bonder 50 such as that shown in FIG. 11 is used to join the bump electrodes of the semiconductor chip to the electrodes of the substrate by thermocompression bonding. The flip chip bonder 50 in FIG. 11 has a thermocompression bonding head 57 with the structure shown in FIG. 12, and has the function of bonding the chip to a substrate S0 by thermocompression bonding, while using a heater 58 to heat a semiconductor chip C held by suction by depressurizing the a suction hole 590 of an attachment 59.

With a flip chip method, the spacing between the semiconductor chip and the substrate is sealed with a resin in order to ensure a reliable joint. A conventional method for resin sealing typically involved injecting a liquid resin into the gap after joining and then hardening the resin with heat, but many methods have also been proposed in which thermocompression bonding is performed in a state in which an adhesive resin is disposed in an uncured state between the semiconductor chip and the substrate (such as Japanese Laid-Open Patent Application Publication No. 2004-315688 (Patent Literature 1)).

A flip chip method that is carried out in a state in which an uncured resin is disposed as an adhesive between the semiconductor chip and the substrate allows resin sealing to be performed at the same time as the joining of the electrodes to each other. Therefore, this method is also suited to three-dimensional mounting in which semiconductor chips having electrodes on its top and bottom faces, such as through-electrodes, are stacked.

SUMMARY

A semiconductor chip having electrodes on its top and bottom faces, such as through-electrodes, differs from a typical semiconductor chip in that there are protrusions produced by electrodes ET on the top face of the semiconductor chip C as well, as shown in FIG. 13. Accordingly, when the chip is held by suction on the thermocompression bonding head 57 of the flip chip bonder 50, there is a gap between the top face of the semiconductor chip C and the attachment 59 of the thermocompression bonding head 57. Since this gap is tiny, it is possible for the semiconductor chip C having electrodes (ET and EB) on its top and bottom faces to be held on the attachment. However, the air around the semiconductor chip C is continually drawn into the suction hole 590, which is under reduced pressure (FIG. 14).

Accordingly, when the semiconductor chip C having electrodes on its top and bottom faces is bonded by thermocompression to a joined piece S (a wiring board, or a stack of semiconductors having electrodes on their top and bottom faces on a wiring board) via an uncured resin R, outgas G is generated from the resin by heating, and is drawn into the suction hole 590. The outgas G contains organic components and the like, and in the course of its being drawn into the suction hole 590, outgas components adhere to the suction face of the attachment 59 and to the inside of the suction hole 590. Adhesion of outgas components to the suction face of the attachment 59 and to the inside of the suction hole 590 gradually builds up over repeated thermocompression bonding, and can foul the suction face of the attachment 59 or clog the suction hole 590, and this can lead to poor suction.

Also, there is the risk that repeated heating can turn the adhering outgas components into carbides, and that these carbides will fall out of the suction hole onto the semiconductor chip C, causing quality defects.

In view of this, as shown in FIG. 15, in order to eliminate the gap between the top face of the semiconductor chip C and the suction face of the attachment 59, a recess 592 can be provided to the suction face of the attachment 59 so as to accommodate the electrode ET on the top face of the semiconductor chip C.

However, if an attempt is made to provide the recess 592 to accommodate the electrode ET on the top face of the semiconductor chip C, since the recess 592 has a larger volume than the electrode ET, a gap is produced between the recess 592 and the electrode ET. When such a gap is produced, heat transfer from the attachment 59 to the semiconductor chip C is hindered in the recess 592, and heating of the semiconductor chip C is no longer adequate. In particular, with a semiconductor chip in which through-electrodes are used for the electrodes on top and bottom faces, heating of the electrode on the bottom face ends up being insufficient, which leads a poor joint. Also, when the pressure is high, a shear stress TA (FIG. 16) occurs around the recess 592, which is undesirable because it can damage the semiconductor chip.

On the other hand, if the suction face of the attachment 59 is flat, since heat and weight are applied only to the electrode ET protruding from the top face of the semiconductor chip C, the fluidity of the uncured resin R on the lower side of the semiconductor chip C is lowered, and resin is caught between electrodes of the semiconductor chip C and the joined piece S, or a void is generated, which can lead to a poor joint.

Another possible method is to perform heating only after stopping the suction before reaching the temperature at which the outgas G is generated and preventing the outgas components from flowing into the suction hole 590, but since the air flow reverses toward the semiconductor chip C due to the pressure differential between the inside and outside of the suction hole 590, the semiconductor chip C may become out of position due to the flow of the resin during heating. Furthermore, delaying the start of heating results in a longer tact time, and this lowers productivity.

The present invention was conceived in light of the above problems, and it is an object thereof to provide a mounting device and a mounting method with which good joint quality is ensured, without any adverse effects due to outgas, when a semiconductor chip having electrodes on its top and bottom faces is bonded by thermocompression to a joined piece having an electrode on its top face, in a state in which an adhesive is interposed between the two.

To solve the above problem, the invention according to a first aspect is a mounting device in which a semiconductor chip having electrodes on its top and bottom faces is bonded by thermocompression to a joined piece that is disposed on the lower side of the semiconductor chip and has an electrode on its top face, in a state in which a thermosetting adhesive is interposed between the two, the mounting device comprising a thermocompression bonding head whose function is to heat the semiconductor chip while holding it and to bond it to the joined piece by compression. The thermocompression bonding head has a suction hole in the face that holds the semiconductor chip. A pressure reduction mechanism is provided that communicates with the suction hole and reduces the pressure inside the suction hole. A resin sheet feed mechanism is further provided that supplies a resin sheet between the thermocompression bonding head and the semiconductor chip. The electrode protruding from the top face of the semiconductor chip is bonded by thermocompression after being embedded in the resin sheet.

The invention according to a second aspect is the mounting device according to the first aspect, further comprising a controller whose function is to set the heating temperature of the thermocompression bonding head. The pressure reduction mechanism has a pressure gauge that measures the pressure inside the suction hole and outputs the measured value to the controller. The controller has the function of changing the heating temperature setting value of the thermocompression bonding head according to the value measured by the pressure gauge.

The invention according to a third aspect is the mounting device according to the first or second aspect, wherein the resin sheet feed mechanism has a hole-making function of forming a through-hole in the resin sheet at a position corresponding to the suction hole.

The invention according to a fourth aspect is the mounting device according to any of the first to third aspects, wherein the mounting device has the function of separating the resin sheet from the semiconductor chip in a state in which the resin sheet is in close contact with the thermocompression bonding head surface after thermocompression bonding.

The invention according to a fifth aspect is the mounting device according to the fourth aspect, further comprising a movement means that separates the thermocompression bonding head and the resin sheet.

The invention according to a sixth aspect is a mounting method for bonding a semiconductor chip having electrodes on its top and bottom faces to a joined piece that is disposed on the lower side of the semiconductor chip and has an electrode on its top face by thermocompression, in a state in which a thermosetting adhesive is interposed between the two, the method comprising the steps of holding the semiconductor chip with a thermocompression bonding head by suction via a resin sheet in which a through-hole is formed at a position corresponding to the suction hole in the thermocompression bonding head; embedding the electrode protruding from the top face of the semiconductor chip in the resin sheet in a state in which the thermocompression bonding head has been brought to a specific temperature or below; and raising the temperature setting of the thermocompression bonding head to join the electrode on the bottom face of the semiconductor chip to the electrode on the top face of the joined piece, and to harden the adhesive with heat.

The invention according to a seventh aspect is the mounting method according to the sixth aspect, wherein, in the step of embedding the electrode protruding from the top face of the semiconductor chip in the resin sheet, the pressure within the suction hole is monitored, and once the pressure falls to a specific level or below, the temperature setting of the thermocompression bonding head is raised to a temperature at which the electrode on the bottom face of the semiconductor chip will be joined to the top face of the joined piece, and the adhesive will be hardened with heat.

The invention according to an eighth aspect is the mounting method according to the sixth or seventh aspect, wherein the resin sheet is separated from the semiconductor chip in a state in which the resin sheet is in close contact with the thermocompression bonding head surface after thermocompression bonding.

The invention according to a ninth aspect is the mounting method according to any of the sixth to eighth aspects, wherein the resin sheet is separated from the thermocompression bonding head after the resin sheet has been separated from the semiconductor chip.

With the present invention, when a semiconductor chip having electrodes on its top and bottom faces is bonded by thermocompression to a joined piece that is disposed on the lower side of the semiconductor chip and has an electrode on its top face, in a state in which a thermosetting adhesive is interposed between the two, the gap produced by the electrode protruding from the top face of the semiconductor chip is filled in by a resin sheet, so the outgas is prevented from coming into contact with the top face side of the semiconductor chip, there are no adverse effects due to the outgas, and the good joint quality can be ensured.

BRIEF DESCRIPTION OF THE DRAWINGS

FIG. 1 is a diagram of the overall configuration of a mounting device pertaining to an embodiment of the present invention;

FIG. 2 is a diagram illustrating a semiconductor chip and a joined piece in the present invention;

DETAILED DESCRIPTION OF EMBODIMENTS

Figure 3:
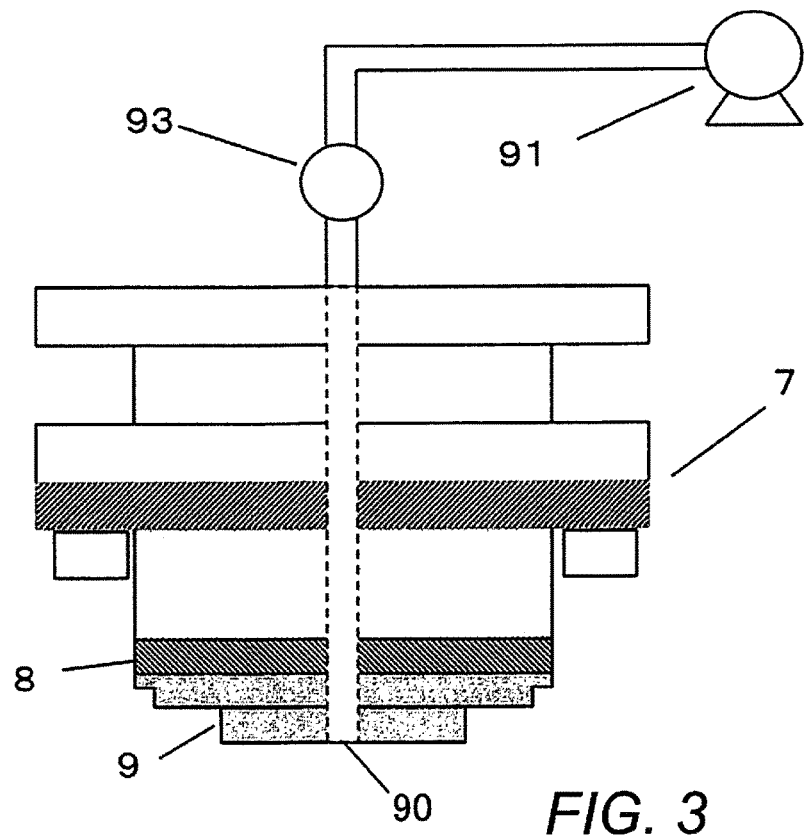
FIG. 3 is a diagram of the configuration of a thermocompression bonding head of the mounting device pertaining to an embodiment of the present invention.

An embodiment of the present invention will now be described through reference to the drawings.

FIG. 1 shows a mounting device 1 pertaining to an embodiment of the present invention.

As shown in FIG. 2, a semiconductor chip C to be mounted with the mounting device 1 has electrodes (through-electrodes) on its top and bottom faces, the electrode EB on the bottom face is a solder bump having solder BS at its distal end, and the electrode ET on the top face protrudes a few microns from the top face. The joined piece S is the substrate S0 shown in FIG. 2A or a laminate of the semiconductor chip C on the wiring substrate S0 as shown in FIG. 2B. Also, in this embodiment, a nonconductive film (hereinafter abbreviated as "NCF") containing a thermosetting resin as its main component is used as an adhesive for bonding the semiconductor chip C and the joined piece S. The NCF is affixed to the surface of the joined piece S, but this is not the only option, and it may instead be affixed to the bottom face of the semiconductor chip C. Furthermore, a nonconductive paste (hereinafter abbreviated as "NCP") containing a thermosetting resin as its main component may be used as an adhesive.

With the mounting device 1 in FIG. 1, the electrode EB on the bottom face of the semiconductor chip C and the electrode ES on the top face of the joined piece S are joined by soldering with the solder BS with the NCF interposed between the joined piece S and the semiconductor chip C, and the semiconductor chip C is mounted on the joined piece S. The mounting device 1 comprises a base 3, a stage 4, a support frame 5, a thermocompression bonding unit 6, a thermocompression bonding head 7, a heater 8, an attachment 9, a resin sheet feed mechanism 2, an image recognition device 10, and a controller 11. Also, the resin sheet feed mechanism 2 includes a resin sheet unwinder 2S and a resin sheet winder 2R as constituent elements.

In the following description, the direction in which the resin sheet P is conveyed from the resin sheet unwinder 2S to the resin sheet winder 2R is referred to as the X axis direction, a direction perpendicular to this as the Y axis direction, the direction of movement of the thermocompression bonding head 7 perpendicular to the joined piece S direction as the Z axis direction, and the direction of rotation around the Z axis as the θ direction.

The base 3 is the main structural body constituting the mounting device 1. The base 3 is configured to have sufficient rigidity. The base 3 supports the stage 4 and the support frame 5.

The stage 4 moves the joined piece S to the desired position while holding the joined piece S. The stage 4 is configured so that a suction table 4b capable of holding the joined piece S by suction is attached to a drive unit 4a. The stage 4 is attached to the base 3, and is configured so that the suction table 4b can be moved in the X axis direction, the Y axis direction, and the θ direction by the drive unit 4a. That is, the stage 4 is configured to be able to move the joined piece S held by suction to the suction table 4b on the base 3 in the X axis direction, the Y axis direction, and the θ direction. In this embodiment, the stage 4 holds the joined piece S by suction, but this is not the only option.

The support frame 5 supports the thermocompression bonding unit 6. The support frame 5 is configured to extend in the Z axis direction from near the stage 4 of the base 3.

The thermocompression bonding unit 6, which is a pressing unit, moves the thermocompression bonding head 7. The thermocompression bonding unit 6 is made up of a servo motor (not shown) and a ball screw. The thermocompression bonding unit 6 is configured to generate a drive force in the axial direction of the ball screw by rotating the ball screw with the servomotor. The thermocompression bonding unit 6 is configured so that the axial direction of the ball screw generates a drive force (pressing force) in the Z axis direction perpendicular to the joined piece S. The thermocompression bonding unit 6 is configured so that a thermocompression load F, which is a pressing force in the Z axis direction, can be set as desired by controlling the output of the servo motor. In this embodiment, the thermocompression bonding unit 6 is constituted by a servomotor and a ball screw, but that is not the only option, and it may instead be constituted by a pneumatic actuator, a hydraulic actuator, or a voice coil motor. The pressing force of the thermocompression bonding unit 6 is controlled so as to be variable according to the number of electrodes of the semiconductor chip C and the contact surface area of the electrodes with the joined piece S.

The thermocompression bonding head 7 holds the semiconductor chip C by suction via the resin sheet P, and transfers the drive force of the thermocompression bonding unit 6 to the semiconductor chip C. The thermocompression bonding head 7 is attached to a ball screw nut (not shown) that is part of the thermocompression bonding unit 6. Also, the thermocompression bonding unit 6 is disposed opposite the stage 4. The thermocompression bonding head 7 is moved in the Z direction by the thermocompression bonding unit 6, so that it approaches the stage 4. The configuration of the thermocompression bonding head 7 is shown in FIG. 3, but the thermocompression bonding head 7 is provided with the heater 8 and the attachment 9.

The heater 8 shown in FIG. 3 is used to heat the semiconductor chip C, and is constituted by a cartridge heater. However, it is not limited to a cartridge heater, and may be a ceramic heater, a rubber heater or the like, as long as it can heat the semiconductor chip C to a specific temperature. Also, the heater 8 is incorporated into the thermocompression bonding head 7, but this is not the only option, and the configuration may instead be such that the heater 8 is incorporated into the stage 4 and the NCF is heated from the stage 4 side via the joined piece S.

The attachment 9 holds the semiconductor chip C via the resin sheet P. The attachment 9 is provided to the thermocompression bonding head 7 and opposite the stage 4. The attachment 9 is configured to be able to hold the semiconductor chip C by suction while positioning it. Also, the attachment 9 is configured so as to be heated by the heater 8. That is, the attachment 9 is configured to position and hold the semiconductor chip C and to heat the semiconductor chip C by heat transfer from the heater 8. The attachment 9 is provided with a suction hole 90 for applying suction to the semiconductor chip C, and the suction hole 90 communicates with a pressure reducing mechanism 91 consisting of a vacuum pump or the like. When the pressure reducing mechanism 91 is switched on, the interior of the suction hole 90 is depressurized, and the attachment 9 holds the semiconductor chip C by suction via the resin sheet P, which has opening (discussed below). A pressure gauge 93 for measuring the pressure inside the suction hole 90 is also provided. In FIG. 3, only one suction hole 90 is provided, but this is not the only option, and there may be a plurality of suction holes 90, with the number being increased according to the size of the semiconductor chip C to be held by suction.

The resin sheet P will not stick to the attachment 9 even if the NCF sticks out from the semiconductor chip C during final pressing, so the attachment 9 can have a pressing face whose outer peripheral size is larger than that of the semiconductor chip C. Therefore, heat can be transferred to the entire surface up to the peripheral part of the semiconductor chip C, the fillet shape of the NCF sticking out to the outer periphery of the semiconductor chip C can be stabilized, and joint strength can be raised. Also, if the outer peripheral size of the face against which the semiconductor chip C is pressed is made smaller than the pitch size of the mounting, final pressing can be performed will less interference between adjacent semiconductor chips C. It is preferable to use a material having a thermal conductivity of 50 W/mK or higher for the attachment 9 in order to transfer heat efficiently.

It is preferable for the attachment 9 to be configured so that it can be separated from and detached from the heater 8, because this will make it less expensive and it will be able to accommodate various kinds of product by exchanging the product, but the attachment 9 may have an integrated structure.

The resin sheet feed mechanism 2 has the resin sheet unwinder 2S and the resin sheet winder 2R as constituent elements, and a tape-like resin sheet P wound around the resin sheet unwinder 2S is supplied between the attachment 9 and the semiconductor chip C and then wound onto the resin sheet winder 2R. In addition to the resin sheet unwinder 2S and the resin sheet winder 2R, the resin sheet feed mechanism 2 may also have a guide roll or the like for stably conveying the resin sheet P. Also, since the attachment 9 holds the semiconductor chip C by suction via the resin sheet P, it is also necessary to provide an opening P0 to the resin sheet P at a position corresponding to the suction hole 90 of the attachment 9. One way to provide the opening P0 to the resin sheet P is to use a hole punching device 2H (see FIG. 6) in the resin sheet feed mechanism 2. However, the method for providing the opening P0 is not limited to this, and a method in which the opening is aligned with the suction hole 90 using the resin sheet P having an opening portion from the outset may be used, for example. The resin sheet P here is preferably a material that is flexible, has excellent heat resistance, and has excellent adhesion to the semiconductor chip. Favorable materials having these properties include polytetrafluoroethylene (PTFE), tetrafluoroethylene/perfluoroalkyl vinyl ether copolymer (PFA), and other such fluororesins. The thickness is preferably about 20 to 50 μm in consideration of thermal conductivity to the semiconductor chip while maintaining good mechanical strength.

The image recognition device 10 acquires position information about the semiconductor chip C and the joined piece S from an image. The image recognition device 10 is configured to perform image recognition of an alignment mark on the top face of the joined piece S held on the stage 4 and an alignment mark on the bottom face of the semiconductor chip C held by the attachment 9, and thereby acquire position information about the joined piece S and the semiconductor chip C. The alignment mark on the joined piece S is an alignment mark made on the wiring substrate S0 when the joined piece S is just the wiring substrate S0, but when the joined piece S is a laminate of the semiconductor chip C on the wiring substrate S0, the alignment mark made on the wiring substrate S0 or the alignment mark on the uppermost semiconductor chip C in the stack is used.

Figure 4:
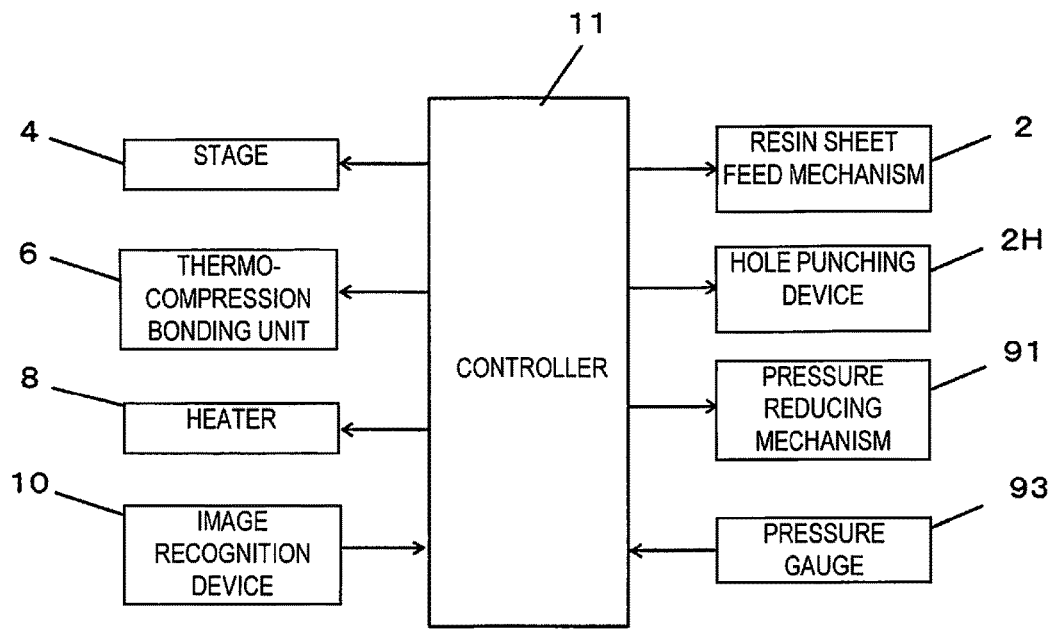
FIG. 4 is a diagram of the control configuration of the mounting device pertaining to an embodiment of the present invention.

As shown in FIG. 4, the controller 11 controls the constituent components of the mounting device 1. More specifically, the controller 11 may be configured such that a CPU, a ROM, a RAM, an HDD, and the like are connected by a bus, or it may be constituted by a one-chip integrated circuit or the like. The controller 11 stores various programs and data for controlling the constituent components of the mounting device 1.

The controller 11 is connected to the stage 4 and can control the amount of movement of the stage 4 in the X axis direction, the Y axis direction, and the θ axis direction. The controller 11 is also connected to the heater 8 and can control the temperature of the heater 8. In particular, the controller 11 can keep the average temperature during pressing with the thermocompression bonding head 7 to within a certain range that is at or above the curing temperature of the NCF and at or above the melting point of solder. The controller 11 is connected to the thermocompression bonding unit 6 and can control the pressing force of the thermocompression bonding unit 6 in the Z axis direction. The controller 11 is also connected to the pressure reducing mechanism 91 that communicates with the suction hole 90 of the attachment 9, and can control the suction state of the attachment 9. The controller 11 is connected to the resin sheet feed mechanism 2 and can convey the resin sheet P directly below the attachment 9. The controller 11 is also connected to the image recognition device 10 and can control the image recognition device 10 to acquire position information about the semiconductor chip C and the joined piece S.

The mounting step using the mounting device 1 pertaining to the present invention will now be described through reference to FIGS. 5 to 10.

Figure 5A:
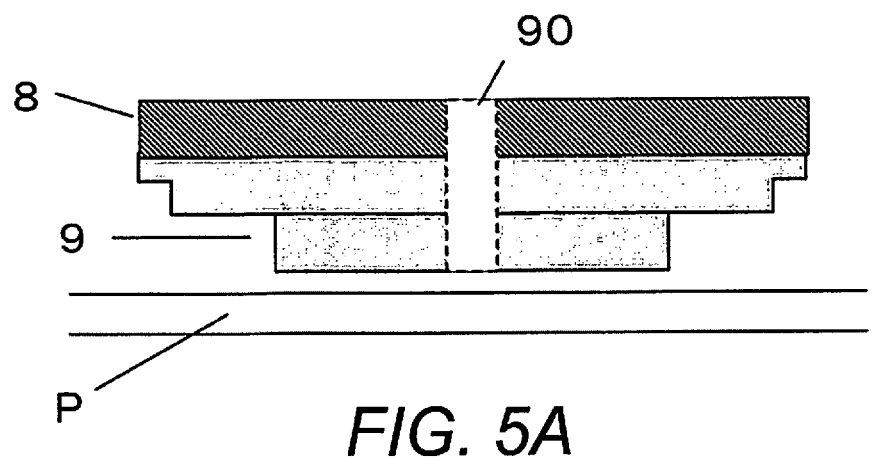
FIG. 5A shows a state in which a resin sheet has been separated from an attachment pertaining to an embodiment of the present invention.
Figure 5B:
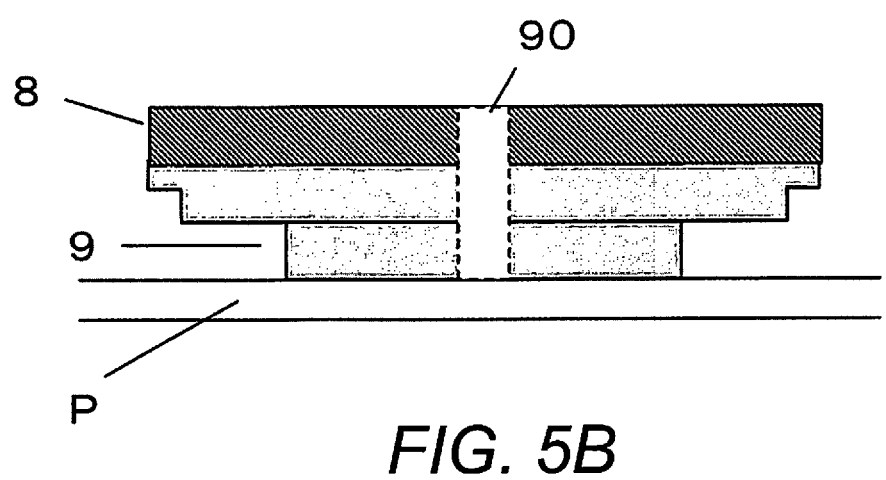
FIG. 5B shows a state in which the resin sheet is in close contact with the attachment surface.
Figure 6A:
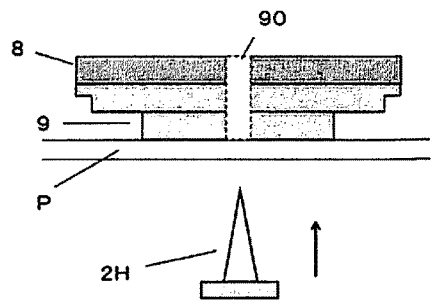
FIG. 6A shows a state in which the needle of a hole punching device pertaining to an embodiment of the present invention is aligned with the suction hole in the attachment.
Figure 6B:
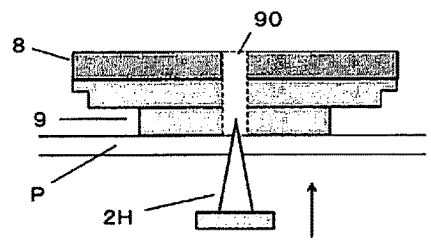
FIG. 6B shows the process by which this hole punching device makes an opening in a resin sheet.
Figure 6C:
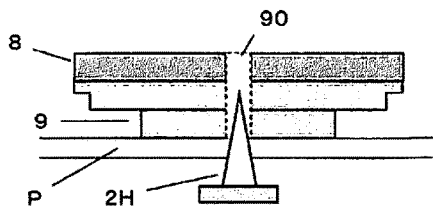
FIG. 6C shows a state further along in the process by which this hole punching device makes an opening in a resin sheet.
Figure 6D:
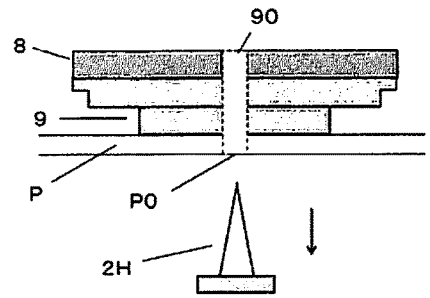
FIG. 6D shows a state in which an opening has been formed in the resin sheet this hole punching device.

First, as shown in FIG. 5, the resin sheet P is brought from a state of being separated from the surface of the attachment 9 (FIG. 5A), into close contact with the surface of the attachment 9 (FIG. 5B). In this operation, if the relative distance between the attachment 9 and the resin sheet P is to be shortened, the resin sheet P may be raised by the resin sheet feed mechanism 2 even if the attachment 9 is lowered by the thermocompression bonding unit 6.

Next, the process of providing the opening P0 to the resin sheet at a position corresponding to the suction hole 90 of the attachment 9 in a state in which the resin sheet P is in close contact with the attachment 9 surface is shown in FIG. 6. Specifically, the hole punching device 2H is raised (FIGS. 6A to 6C) from a state in which a needle 2HN of the hole punching device 2H is aligned with the suction hole 90 (FIG. 6A), and the hole punching device 2H is lowered after forming a through-hole in the resin sheet P. The result of this is that the opening P0 is formed in the resin sheet P at a position corresponding to the suction hole 90 of the attachment 9 (FIG. 6D).

Figure 7A:
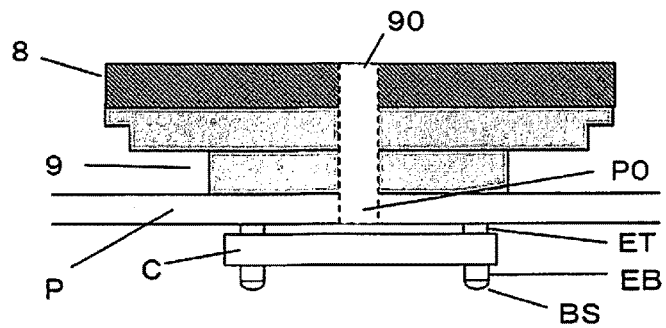
FIG. 7A is a diagram illustrating a state in which an attachment at the distal end of the thermocompression bonding head of the mounting device pertaining to an embodiment of the present invention is applying suction to the semiconductor chip via the resin sheet.

In this state, the semiconductor chip C is disposed directly under the attachment 9 by a semiconductor chip transfer mechanism (not shown). When the pressure reducing mechanism 91 is turned on at this stage, the semiconductor chip C is drawn by suction to the resin sheet P directly under the attachment 9 (FIG. 7A).

In the process of drawing the semiconductor chip by suction to the resin sheet P from the above process of bringing the attachment 9 into close contact with the resin sheet P, the temperature of the heater 8 is set to a temperature at which outgassing from the NCF will not occur. The temperature at which outgassing from the NCF will not occur varies with the composition of the NCF, but 120° C. or lower is preferable, and 100° C. or lower is more preferable.

Figure 7B:
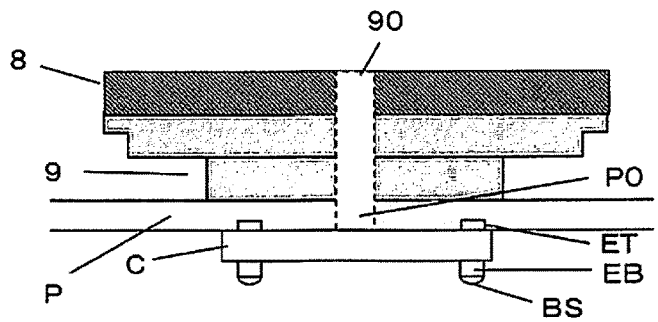
FIG. 7B shows a state in which the electrode protruding from the top face of the semiconductor chip that is being held by suction against this attachment through the resin sheet is embedded in the resin sheet.

After this, as shown in FIG. 7B, the temperature setting of the heater 8 may be over the temperature at which outgassing from the NCF occurs, so long as the electrode ET protruding from the top face of the semiconductor chip C is embedded in the resin sheet P. That is, even if the temperature setting of the heater 8 is a temperature at which outgassing from the NCF occurs, the outgas will not adhere to the interior of the suction hole 90 or to the attachment 9 surface. Therefore, if the state is as in FIG. 7B, the temperature setting of the heater 8 can be a temperature that will result in the melting of the solder BS and the curing of the NCF, and the semiconductor chip C can be bonded by thermocompression to the joined piece S. Whether or not the state is as shown in FIG. 7B can be ascertained from the pressure inside the suction hole 90. If the state is as in FIG. 7B, when the pressure reducing mechanism 91 is switched on, the pressure drop will be large (on the high vacuum side) since the interior of the suction hole 90 is in a sealed state, but by contrast, the pressure drop inside the suction hole 90 will be small unless the electrode ET protruding from the top face of the semiconductor chip C is embedded in the resin sheet P. Therefore, the pressure inside the suction hole 90 is monitored with the pressure gauge 93 after the semiconductor chip C has been brought into close contact with the resin sheet P, and it can be determined that the state in FIG. 7B has been reached once this measured value drops to or under a specific value. It is also possible to use a flow meter instead of the pressure gauge 93 to determine that the state in FIG. 7B has been reached once the valued measured by the flow meter drops to or under a specific value.

Figure 8A:
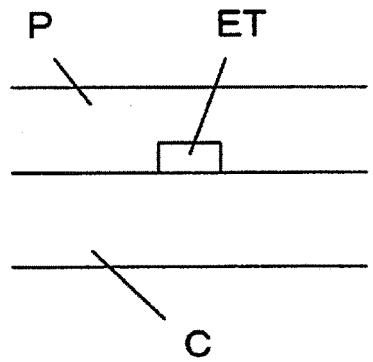
FIG. 8A is a simulation of when the electrode of the semiconductor chip is embedded in the resin sheet.
Figure 8B:
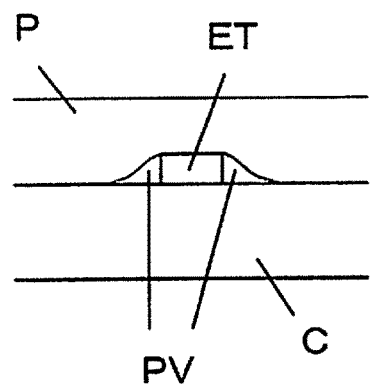
FIG. 8B shows an example of when the electrode of the semiconductor chip is embedded in the resin sheet.

In FIG. 7B, the state in which the electrode ET is embedded in the resin sheet P is depicted as a simulation as in FIG. 8A, but in fact a gap PV is formed around the electrode ET, as shown in the example in FIG. 8B. However, since the resin sheet P around the gap PV is in close contact with the top face of the semiconductor chip C, the pressure inside the suction hole 90 decreases.

Sometimes the electrode ET protruding from the top face of the semiconductor chip C can be embedded in the resin sheet P as shown in FIG. 7B merely by reducing the pressure inside the suction hole 90 from the state in FIG. 7A, but sometimes the electrode ET will just slightly sink into the resin sheet P. A state such as this can be determined from the fact that the pressure inside the suction hole 90 is at or below a specific value. In this case, the gas around the semiconductor chip C is absorbed into the interior of the suction holes 90 or the surface of the attachment 9. Therefore, at this stage, the temperature setting of the heater 8 must be kept at a temperature at which outgassing from the NCF will not occur.

Figure 9A:
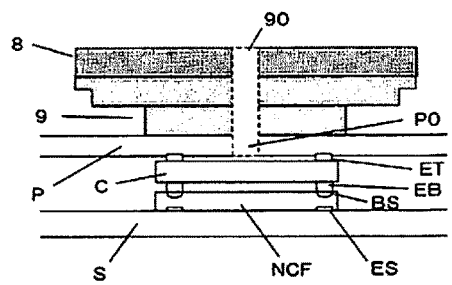
FIG. 9A is a diagram of the process of bringing the semiconductor chip close to the joined piece with the mounting device pertaining to an embodiment of the present invention.
Figure 9B:
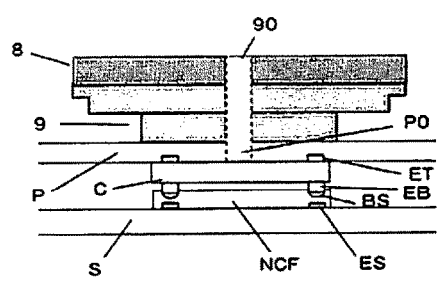
FIG. 9B shows a state in which the electrode protruding from the top face of the semiconductor chip is embedded in the resin sheet in this process.
Figure 9C:
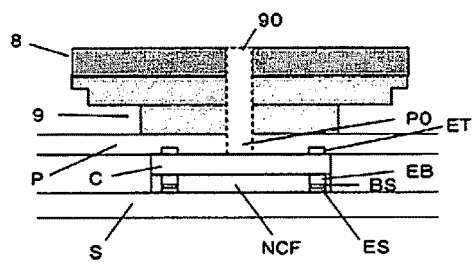
FIG. 9C shows a state in which the semiconductor chip has been mounted on the joined piece by a thermocompression bonding step after this process.
Figure 9D:
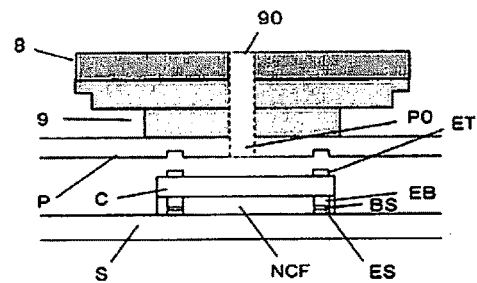
FIG. 9D shows a state in which the resin sheet has been peeled away from the semiconductor chip after the thermocompression bonding step.

If the electrode ET on the top face of the semiconductor chip C does not become embedded in the resin sheet P merely by reducing the pressure inside the suction hole 90, the semiconductor chip C is aligned with the joined piece, after which the temperature setting of the heater 8 is adjusted to a temperature at which outgassing from the NCF will not occur, and in this state the semiconductor chip C is moved in the Z axis direction by the thermocompression bonding unit 6 toward the joined piece S. As a result of this, the electrode EB on the bottom face of the semiconductor chip C comes into contact with the NCF (FIG. 9A), and when further pressure is applied in the Z axis downward direction, the semiconductor chip C is subjected to force from its top and bottom faces. This force from the top and bottom faces causes the electrode ET protruding from the top face of the semiconductor chip C to gradually sink into the resin sheet P, eventually reaching a state in which it is embedded in the resin sheet P (FIG. 9B). Here again, if the pressure inside the suction hole 90 is being monitored by the pressure gauge 93, it can be determined that the electrode protruding from the top face of the semiconductor chip C has become embedded in the resin sheet P from the fact that this measured value has dropped to or under a specific value. At this stage, since there no outgas adhering to the inside of the suction hole 90 or the surface of the attachment 9 even though the temperature setting of the heater 8 is a temperature at which outgassing from the NCF will occur, the temperature setting of the heater 8 can be adjusted to a temperature that will result in the melting of the solder BS and the curing of the NCF, allowing the semiconductor chip C to be mounted by thermocompression bonding to the joined piece S (FIG. 9C). When the mounting of the semiconductor chip C to the joined piece S is complete, with heating by the heater 8 is stopped and the temperature of the attachment 9 is lowered, the thermocompression bonding unit 6 and the resin sheet feed mechanism 2 are moved in the Z axis direction (the opposite direction from the joined piece S), and the resin sheet P is peeled away from the semiconductor chip C (FIG. 9D). After the thermocompression bonding, the resin sheet P is in a state in which the electrode ET protruding from the top face of the semiconductor chip C is embedded, so if just the attachment 9 is raised, the resin sheet P will cool and enter a state in which it cannot be separated from the electrode ET by contraction, so the attachment 9 is preferably raised in a state of being in close contact.

Figure 10A:
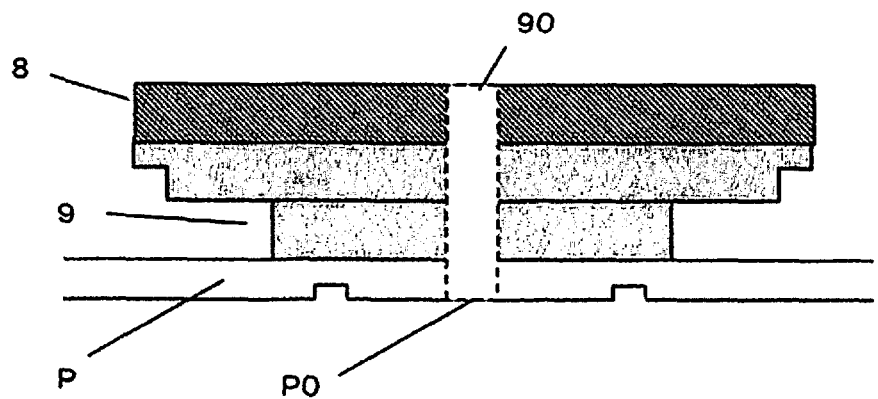
FIG. 10A shows a state in which the resin sheet is in close contact with the attachment at the distal end of the thermocompression bonding head after the thermocompression bonding step pertaining to an embodiment of the present invention.
Figure 10B:
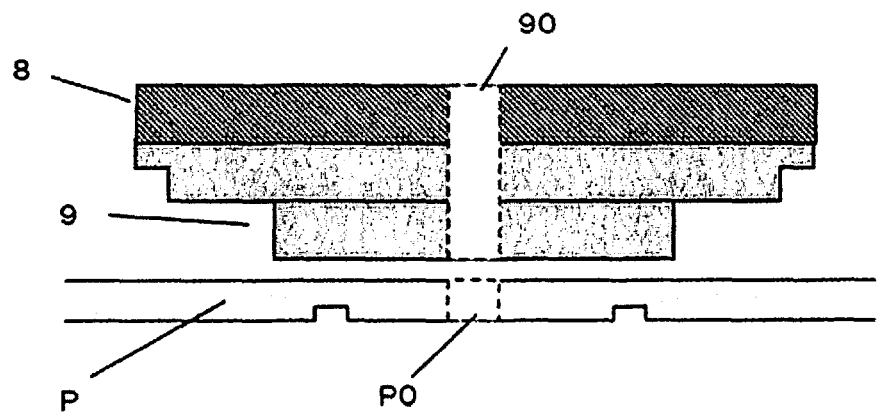
FIG. 10B shows a state in which the resin sheet has been peeled away from this attachment.
Figure 10C:
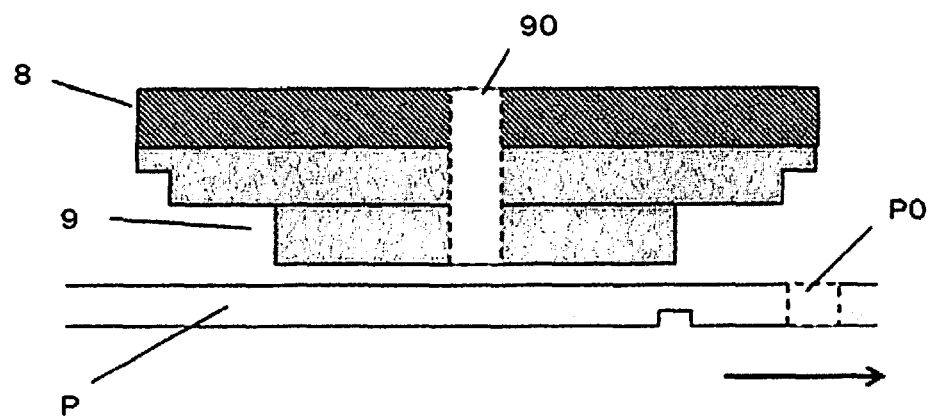
FIG. 10C shows a state in which the resin sheet directly under the attachment is being updated.
Figure 11:
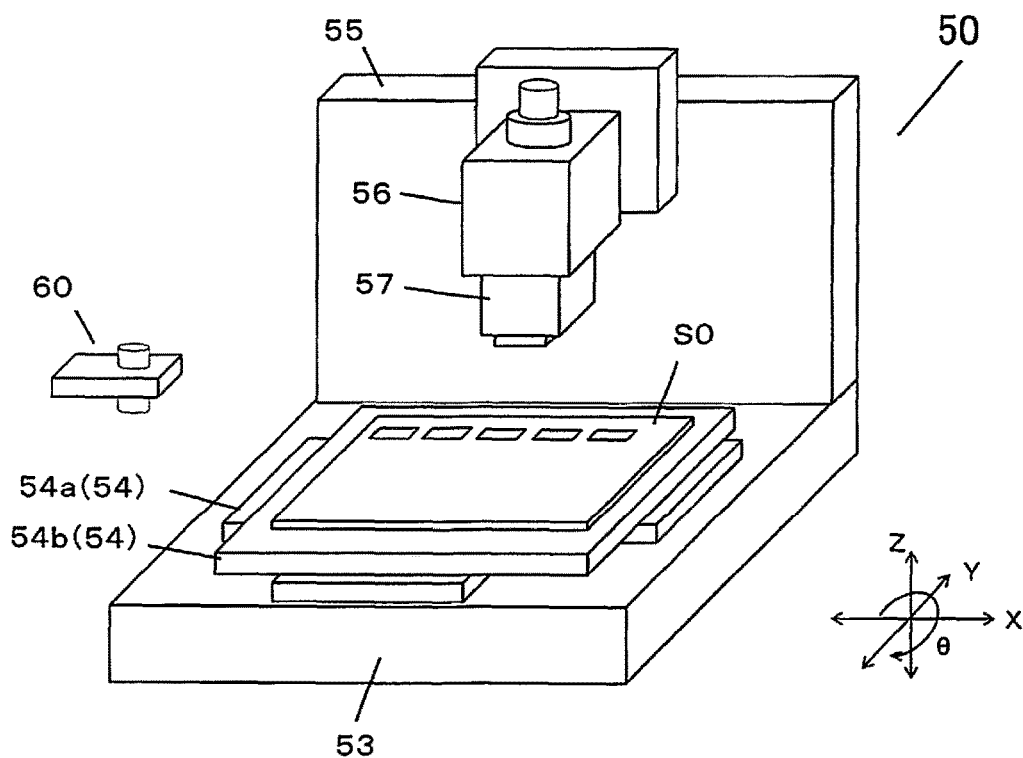
FIG. 11 is a diagram of the configuration of a conventional flip chip bonder.
Figure 12:
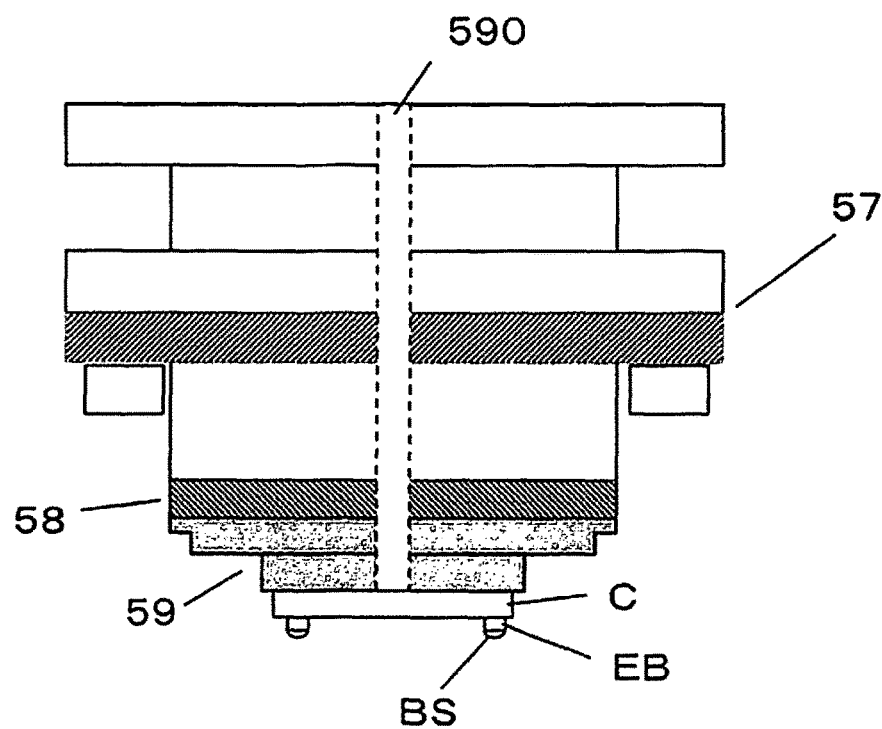
FIG. 12 shows a state in which the thermocompression bonding head of a conventional flip chip bonder is holding a semiconductor chip having an electrode on only its bottom face.
Figure 13:
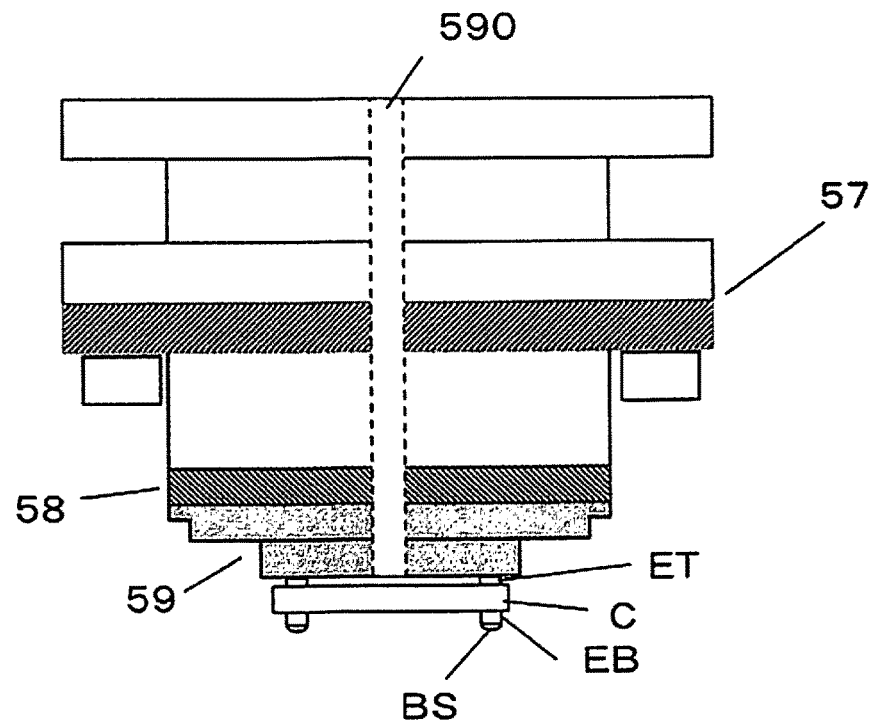
FIG. 13 shows a state in which the thermocompression bonding head of a conventional flip chip bonder is holding a semiconductor chip having electrodes on its top and bottom faces.
Figure 14:
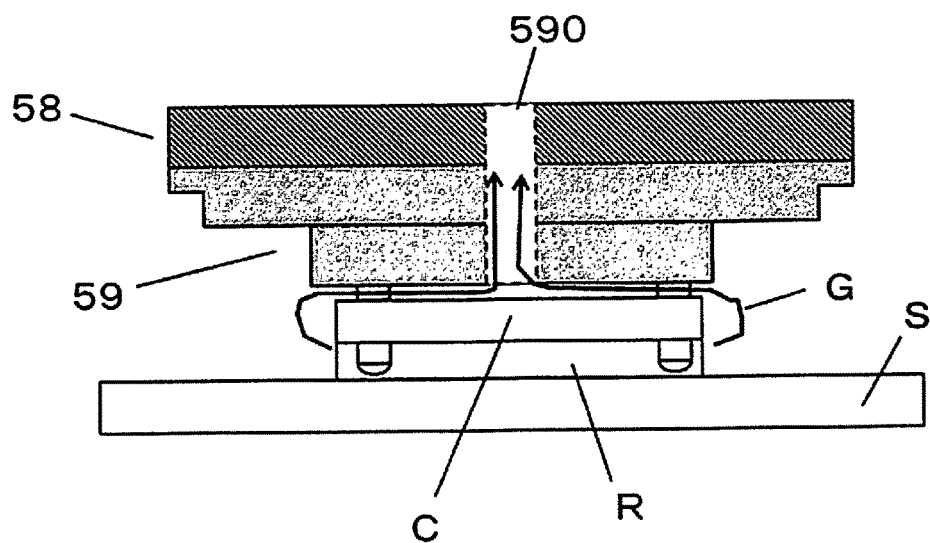
FIG. 14 is a diagram illustrating the outgas generated when a semiconductor chip having electrodes on its top and bottom faces is subjected to thermocompression bonding with a conventional flip chip bonder.
Figure 15:
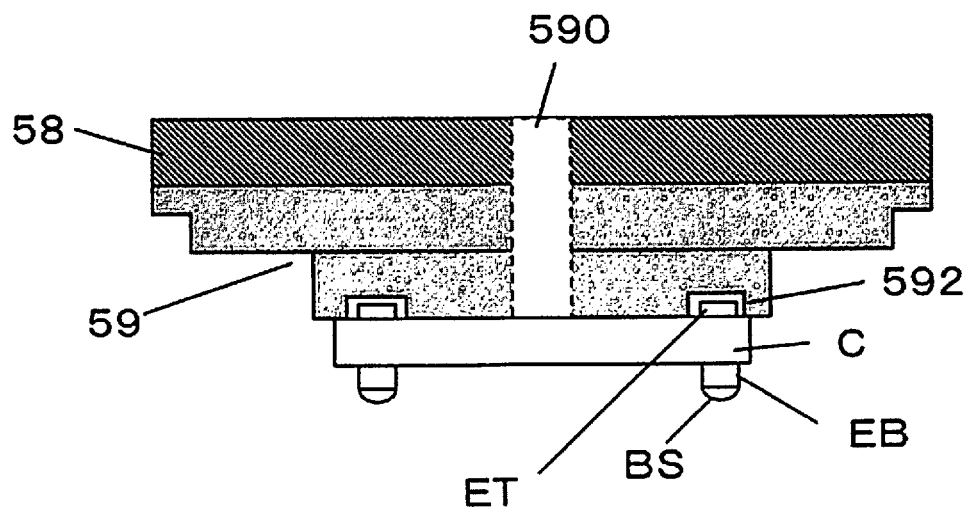
FIG. 15 shows a state in which a recess is provided to the attachment of a thermocompression bonding head with a conventional flip chip bonder to hold a semiconductor chip having electrodes on its top and bottom faces.
Figure 16:
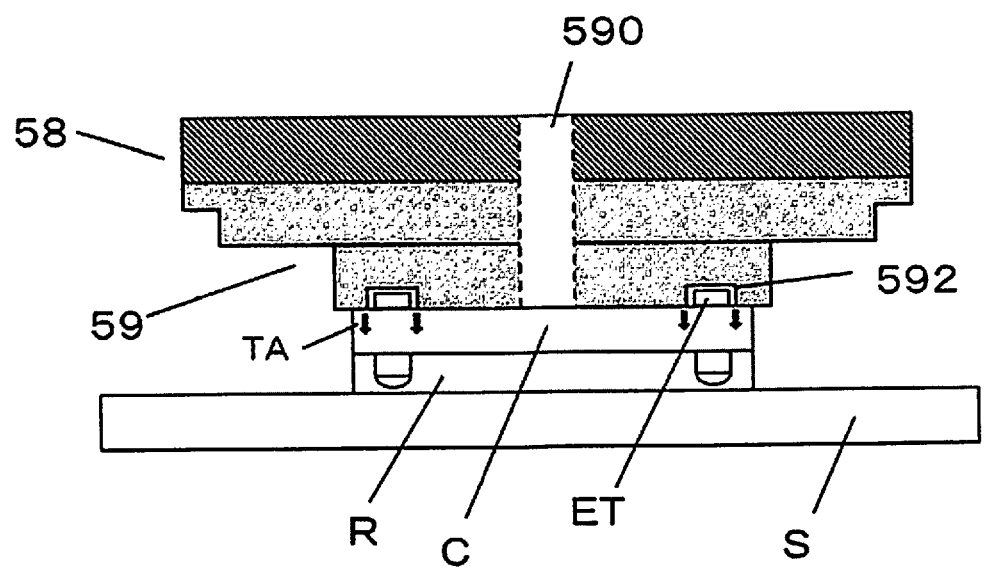
FIG. 16 is a diagram illustrating a problem encountered when a recess is provided to the attachment of a thermocompression bonding head with a conventional flip chip bonder, and a semiconductor chip having electrodes on its top and bottom faces is bonded by thermocompression.

After this, the relative movement of the thermocompression bonding unit 6 and the resin sheet feed mechanism 2 separates the resin sheet P from the attachment 9 surface (FIGS. 10A and 10B). At this stage, because it has undergone a high-temperature process, the resin sheet P directly under the attachment 9 may have physically undergone thermal degradation or have been deformed or soiled. In view of this, the resin sheet feed mechanism 2 is switched on (FIG. 10C), and a resin sheet P that has not undergone a high-temperature process is disposed directly under the attachment 9.

Thereafter, once the temperature of the attachment 9 drops below the temperature at which outgassing from the NCF will occur, either the mounting step is concluded, or the resin sheet feed mechanism 2 is switched on as shown in FIG. 5B and the resin sheet P is brought into close contact with the attachment 9 surface, and then the procedure moves on to the mounting step for the next semiconductor chip C.

The invention claimed is:

1. A mounting device with which a semiconductor chip that has electrodes on top and bottom faces is bonded by thermocompression to a joined piece that is disposed on a lower side of the semiconductor chip and has an electrode on a top face, in a state in which a thermosetting adhesive is interposed between the semiconductor chip and the joined piece, the mounting device comprising:
    a thermocompression bonding head configured to heat the semiconductor chip while holding the semiconductor chip and to bond the semiconductor chip to the joined piece by compression, the thermocompression bonding head having a suction hole in a face that holds the semiconductor chip;
    a pressure reduction mechanism communicating with the suction hole and configured to reduce pressure inside the suction hole; and
    a resin sheet feed mechanism configured to supply a resin sheet between the thermocompression bonding head and the semiconductor chip,
    the electrode protruding from the top face of the semiconductor chip being bonded by thermocompression after being embedded in the resin sheet.

2. The mounting device according to claim 1, further comprising
    a controller configured to set a heating temperature of the thermocompression bonding head,
    the pressure reduction mechanism having a pressure gauge that is configured to measure the pressure inside the suction hole and is configured to output a measured value to the controller, and
    the controller being further configured to change a setting of the heating temperature of the thermocompression bonding head according to the measured value measured by the pressure gauge.

3. The mounting device according to claim 2, wherein
    the resin sheet feed mechanism is configured to form a through-hole in the resin sheet at a position corresponding to the suction hole.

4. The mounting device according to claim 3, wherein
    the mounting device is configured to separate the resin sheet from the semiconductor chip in a state in which the resin sheet is in close contact with a surface of the thermocompression bonding head after thermocompression bonding.

5. The mounting device according to claim 4, further comprising
    a movement mechanism configured to separate the thermocompression bonding head and the resin sheet.

6. The mounting device according to claim 2, wherein
    the mounting device is configured to separate the resin sheet from the semiconductor chip in a state in which the resin sheet is in close contact with a surface of the thermocompression bonding head after thermocompression bonding.

7. The mounting device according to claim 6, further comprising
    a movement mechanism configured to separate the thermocompression bonding head and the resin sheet.

8. The mounting device according to claim 1, wherein
    the resin sheet feed mechanism is configured to form a through-hole in the resin sheet at a position corresponding to the suction hole.

9. The mounting device according to claim 8, wherein
    the mounting device is configured to separate the resin sheet from the semiconductor chip in a state in which the resin sheet is in close contact with a surface of the thermocompression bonding head after thermocompression bonding.

10. The mounting device according to claim 9, further comprising
    a movement mechanism configured to separate the thermocompression bonding head and the resin sheet.

11. The mounting device according to claim 1, wherein
    the mounting device is configured to separate the resin sheet from the semiconductor chip in a state in which the resin sheet is in close contact with a surface of the thermocompression bonding head after thermocompression bonding.

12. The mounting device according to claim 11, further comprising
    a movement mechanism configured to separate the thermocompression bonding head and the resin sheet.

13. A mounting method for bonding a semiconductor chip that has electrodes on top and bottom faces to a joined piece that is disposed on a lower side of the semiconductor chip and has an electrode on a top face by thermocompression, in a state in which a thermosetting adhesive is interposed between the semiconductor chip and the joined piece, the method comprising:
    holding the semiconductor chip with a thermocompression bonding head by suction via a resin sheet in which a through-hole is formed at a position corresponding to a suction hole in the thermocompression bonding head;
    embedding the electrode protruding from the top face of the semiconductor chip in the resin sheet in a state in which the thermocompression bonding head has been brought to a specific temperature or below; and
    raising a temperature setting of the thermocompression bonding head to join the electrode on the bottom face of the semiconductor chip to the electrode on the top face of the joined piece, and to harden the thermosetting adhesive with heat.

14. The mounting method according to claim 13, wherein the embedding of the electrode protruding from the top face of the semiconductor chip in the resin sheet includes monitoring the pressure within the suction hole, and raising the temperature setting of the thermocompression bonding head to a temperature at which the electrode on the bottom face of the semiconductor chip is joined to the top face of the joined piece, and the thermosetting adhesive is hardened with heat once the pressure falls to a specific level or below.

15. The mounting method according to claim 14, further comprising
separating the resin sheet from the semiconductor chip in a state in which the resin sheet is in close contact with a surface of the thermocompression bonding head after thermocompression bonding.

16. The mounting method according to claim 15, further comprising
separating the resin sheet from the thermocompression bonding head after separating the resin sheet from the semiconductor chip.

17. The mounting method according to claim 14, further comprising
separating the resin sheet from the thermocompression bonding head after separating the resin sheet from the semiconductor chip.

18. The mounting method according to claim 13, further comprising
separating the resin sheet from the semiconductor chip in a state in which the resin sheet is in close contact with a surface of the thermocompression bonding head after thermocompression bonding.

19. The mounting method according to claim 18, further comprising
separating the resin sheet from the thermocompression bonding head after separating the resin sheet from the semiconductor chip.

20. The mounting method according to claim 13, further comprising
separating the resin sheet from the thermocompression bonding head after separating the resin sheet from the semiconductor chip.

* * * * *